Nov. 23, 1965 R. H. GRAHAM 3,219,825
SOLID STATE RADIATION DETECTION SYSTEM
WITH LOW NOISE AMPLIFICATION
Filed Dec. 18, 1962
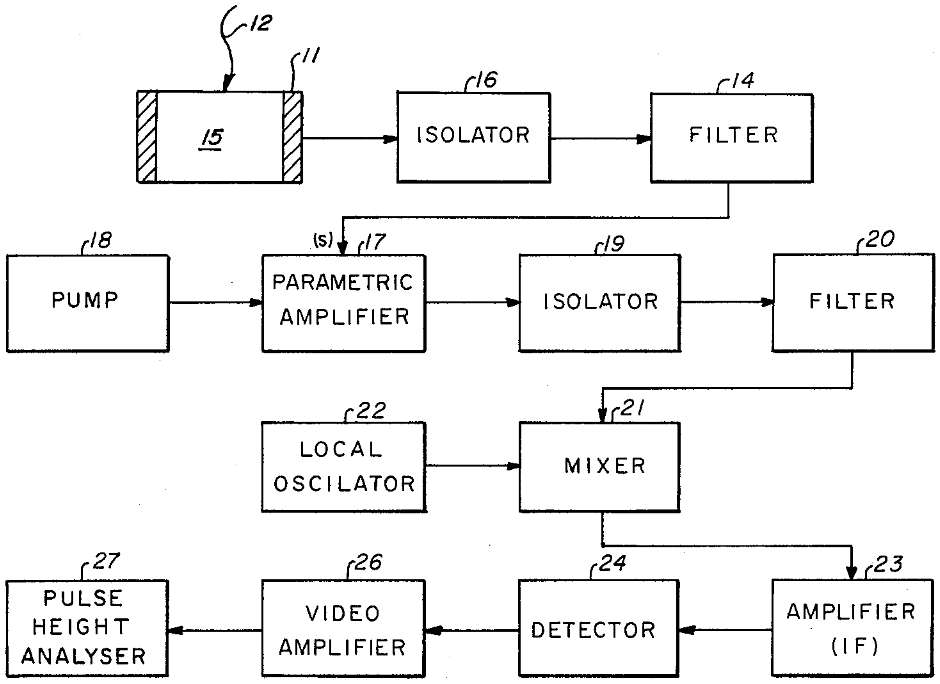
INVENTOR.
RICHARD H. GRAHAM
BY
ATTORNEY 3,219,825
SOLID STATE RADIATION DETECTION SYSTEM WITH LOW NOISE AMPLIFICATION Richard H. Graham, Glastonbury, Conn., assignor to the United States of America as represented by the United States Atomic Energy Commission Filed Dec. 18, 1962, Ser. No. 245,953
6 Claims. (Cl. 250—83.3)

This invention relates to radiation detection systems which employ solid state radiation detectors, and is particularly directed to a system of this type which has an outstanding signal-to-noise ratio.

Various solid state devices, such as reverse biased, PN junction, semiconductor diodes, may be employed to detect radiation with numerous advantages over other types of radiation detectors. More particularly, solid state detectors are capable of faster response times and better overall resolutions than prior radiation detectors of the more conventional types. At the same time, however, the performance of solid state radiation detectors has been severely limited by the relatively low level of their output signals. The output signals from a solid state detector are not much larger in magnitude than the noise level of associated electronic circuits for amplifying the signals to a level suitable for measurement and analysis. The noise may readily give rise to extraneous signals which cannot be distinguished from the radiation signals, and which thereby minimize the sensitivity and energy resolution of the detection system.

The present invention overcomes the previously noted difficulty of solid state radiation detectors by providing same, in a special fashion, with an initial stage of amplification of extremely low noise level. More explicitly, a parametric amplifier is utilized as an initial stage of amplification for the output signals from a solid state radiation detector. As is disclosed in an article entitled "Diode Parametric Amplifiers—Principles and Experiments," by E. D. Reed, which appears in Semiconductor Products, January-February 1961, the parametric amplifier operates without the migration of electrons or holes, the mechanism responsible for noise generation. The parametric amplifier is thus inherently capable of quieter amplification than the more conventional transistor and vacuum tube types of amplifiers. However, parametric amplifiers are only operable in the amplification of radio frequency signals, whereas the signal from a solid state radiation detector is in the form of unidirectional pulses. The effective operability of the instant combination is believed ascribable principally to occurrence of certain frequency components in the solid state detector signal pulses. Thus is afforded an efficacious means of providing an amplified solid state signal imminently suited for processing by detector, radiation analyzing equipment or the like at outstanding signal-to-noise ratios.

Accordingly, it is an object of the present invention to provide an improved solid state radiation detector system which, in addition to possessing the usual superior response time and resolution characteristics associated with solid-state devices, has an outstanding signal-to-noise ratio.

Another object of the invention is the provision of a radiation detector system which is so arranged that a parametric amplifier is employable as an initial stage of amplification for radiation output signal pulses from a solid state detector.

It is a further object of the invention to provide a radiation detection system of the class described wherein a radio frequency component of the pulse output signal from a solid state radiation detector is amplified by a parametric amplifier to provide radiation signal data of a sufficiently high level that it may be processed by various electronic analyzing circuits and the like without detriment from noise generated therein.

Other objects and advantages of the invention will become apparent from the following description and claims considered together with the accompanying drawing in which the single figure is a block diagram of a solid state radiation detection system in accordance with the present invention.

Considering now the invention in some detail and referring to the illustrated form thereof in the drawing, there will be seen to be generally provided a radiation detection system including a solid state radiation detector of a type which responds to incident radiation by the issuance of current pulses therefrom. These output pulses are inherently of too low a level to be suitable for measurement and analysis purposes. Accordingly, it is necessary that the pulses be converted to an amplified form, and in this regard it is particularly important to note that a substantially noiseless amplification mechanism is required because of the extremely low level of the radiation pulses. To this end, the system of the present invention includes a parametric amplifier which, as is well known, is capable of substantially noiseless amplification of radio frequency signals. In accordance with the particularly salient aspects of the present invention means are provided to convert the pulse output from the detector to a form congruous with amplification by the parametric amplifier. Preferably, such means are arranged to separate one of the various radio frequency components found occurring in the output pulse of such a detector, from the remaining components and apply the selected component as an input signal to the parametric amplifier, where it becomes amplified. The resulting output signal is of a sufficient level that it may be operated upon by additional conventional stages of amplification and analyzing equipment with negligible effect from the relatively low level noise inherently generated therein.

A preferred arrangement of the radiation detection system broadly outlined hereinbefore, as depicted in the drawing, includes a solid state radiation detector 11 which is preferably a PN junction diode with a reverse bias applied thereacross in the conventional manner to establish a depletion layer 15. The depletion layer 15 acts as a detection medium which responds to incident radiation, as depicted at 12, by the release of an electron-hole pair. The freed electron-hole pair generates a short current pulse in traveling to the edges of the depletion layer 15 by virtue of the electric field thereacross imposed by the reverse bias. The pulse generated by the migrating electron-hole pair has a duration of, for example, $10^{-8}$ seconds and is found to contain various radio frequency components.

For separating one of the radio frequency components from the remainder of the radio frequency constituents of the detector pulse, there is provided a selective filter 14, which is passive to a predetermined component of interest, for example, the fundamental frequency, while being impassive to all other radio frequency components. The filter 14 is coupled to the output of detector 11 as by means of an isolator 16 which serves to prevent any signals from the rest of the system from getting back to the detector. Thus, the predetermined radio frequency component of each output pulse from the detector is passed by the filter while the other components are discarded. The radio-frequency output signal "*s*," from the filter is fed to a parametric amplifier 17.

Parametric amplifier 17 is most advantageously of the up-converter type, and preferably of the lower side band up-converter type. As is well known, this type of amplifier is energized by both the input signal, *s*, and another signal, known as a pump signal, "*p*," which is applied to the amplifier from a relatively high frequency and power microwave energy source or pump 18. The pump signal provides the active radio frequency energy in producing an amplified output signal which has a frequency equal to the difference between the frequencies of the pump and input signals. The gain for such a lower side band up-converter parametric amplifier may be generally expressed by the relationship:

$$K = \frac{f_p f_s}{f_s}$$

where K is gain; $f_p$ is the frequency of the pump signal, *p;* and $f_s$ is the frequency of the input signal, *s*. It will thus be appreciated that for appreciable gains, the pump frequency, $f_p$, must be considerably greater than the signal frequency, $f_s$, for example, an order of magnitude greater than the pump frequency. With this in mind, an advantageous pump frequency, $f_p$, has been found in practice to be 1,000 megacycles for an input frequency, $f_s$, as selected by filter 14, typically of the order of 100 megacycles. With such values of the parameters a gain of nearly ten is readily realized, and the output signal from the amplifier is of a sufficiently high level that it may be treated by additional stages of amplification and various analyzing devices of a more conventional type to reduce the signal data to an operational condition without detriment from noise. More particularly, the noise signals generated in the various stages which may be provided following the parametric amplifier are of a negligible level compared to the output signal derived therefrom.

To facilitate the previously noted reduction of the output signal data from parametric amplifier 17 to an operational condition, the output of such amplifier is advantageously coupled through an isolator 19 and a selective filter 20 to one input of a mixer 21. Filter 20 is adapted to be passive to only signals in the lower side band produced in the parametric amplifier. In other words the filter passes the output signal of frequency, $f_p - f_s$, to the mixer, while rejecting any other signal frequencies emanating from the parametric amplifier.

Another input of the mixer 21 is driven by a local oscillator 22 to produce an intermediate frequency signal containing the signal data of the lower side band output signal from the parametric amplifier. An intermediate frequency amplifier 23 coupled to the mixer output amplifies the intermediate frequency signal and applies same to a detector 24. The detector demodulates the intermediate frequency signal to produce an output which is an amplified form of the input signal, *s*. Inasmuch as the signal, *s*, is the predetermined radio frequency component selected by filter 14 from the respective pulses from solid state detector 11, and such component proves to have a magnitude proportional to that of the pulses from which it is derived, the amplitude characteristic of the signal, *s*, corresponds to that of the radiation detector pulses. Hence the signal at the output of detector 24 is an amplified representation of the pulse height characteristics of the output pulses from solid state radiation detector 11. The amplified pulse height signal may be applied to a video amplifier 26 for further amplification and then to a pulse height analyser 27 for sorting according to pulse height in the usual manner.

It wil be appreciated that the heterodyne type of demodulation system including mixer 21, local oscillator 22, intermediate frequency amplifier 23, and detector 24, is but one of various conventional means per se that may be employed to reduce the output signal data from the parametric amplifier 18 to an operational condition. Irrespective of the particular signal data reduction means employed, it will be appreciated that by virtue of the basic combination of a solid state detector with a parametric amplifier, the amplified output signal data from the parametric amplifier is of a sufficiently high level that noise generated by the reduction means has a negligible adverse effect on the radiation signal data during its processing.

There has thus been described a radiation detection system employing a solid state radiation detector which is characterized by an outstanding signal-to-noise ratio, and while the salient features have been described in detail with respect to a single embodiment, it will be readily apparent that many modifications may be made within the spirit and scope of the invention and it is, therefore, not desired to limit the invention to the exact details except insofar as they may be set forth in the following claims.

What is claimed is:

1. In a radiation detection system the combination comprising a solid-state radiation detector including a PN junction diode having a region deplete of electrons and holes by application of a reverse bias thereto and disposed to receive incident radiation therein and respond thereto by the release of electron-hole pairs in proportional relation to said incident radiation, said electron-hole pairs defining unidirectional current pulses having a magnitude proportional to said incident radiation, each of said pulses being comprised of a plurality of radio frequency components proportional to the magnitude thereof, a parametric amplifier energized with a microwave pump signal, and means for selecting a predetermined one of said radio frequency components from said pulses and energizing said parametric amplifier with the selected radio frequency component to produce an amplified output signal therefrom including the selected radio frequency component as a measure of said incident radiation.

2. In a radiation detection system, the combination comprising a solid state radiation detector including a PN junction diode having a region deplete of electrons and holes by application of a reverse bias thereto and disposed to receive incident radiation therein and respond thereto by the release of electron-hole pairs in proportional relation to said incident radiation, said electron-hole pairs defining unidirectional current pulses having a magnitude proportional to said incident radiation, each of said pulses being comprised of a plurality of radio frequency components proportional to the magnitude thereof, means coupled to said detector for selecting a predetermined one of said radio frequency components from said pulses, a parametric amplifier having a pump input, a signal input for receiving radio frequency signals at the frequency of the predetermined component, and an output, a microwave pump source coupled in energizing relation to said pump input to introduce a pump signal to said amplifier, and means for introducing the selected radio frequency component to said signal input of said amplifier.

3. In a radiation detection system as defined by claim 2, the combination further defined by means coupled to the output of said amplifier for selecting a sideband signal therefrom, said sideband signal including amplified components of said pump signal and said selected radio frequency component of said pulses, and means for receiving said sideband signal and separating the components thereof.

4. A radiation detection system comprising a solid state radiation detector including a PN junction diode having a region deplete of electrons and holes by application of a reverse bias thereto and disposed to receive incident radiation therein and respond thereto by the release of electron-hole pairs in proportional relation to said incident radiation, said electron-hole pairs defining unidirectional current pulses having a magnitude proportional to said incident radiation, each of said pulses being comprised of a plurality of radio frequency components proportional to the magnitude thereof, a filter coupled to the output of said detector, said filter passive to a predetermined one of said components and impassive to the others thereof to provide a radio frequency signal proportional to the magnitudes of said pulses and at the frequency of the predetermined component, a parametric amplifier for combining an input signal having a frequency equal to that of said predetermined component with a pump signal to produce an output including a resultant amplified sideband signal having components proportional to the input and pump signals, a microwave pump source coupled to said amplifier to introduce a pump signal thereto, means coupling said filter to said amplifier to introduce said radio frequency signal thereto, a second filter coupled in receiving relation to the output of said amplifier passive to said sideband signal and impassive to other signals, demodulation means coupled to said second filter in receiving relation to said sideband signal for separating said input and pump signal components thereof, and pulse analyzing means coupled to said demodulation means in receiving relation to the separated input signal component of said sideband signal.

5. A radiation detection system according to claim 4, wherein said demodulation means comprises a mixer having first and second inputs and an output, said first input coupled to said second filter in receiving relation to said sideband signal, an oscillator coupled to said second input of said mixer, an intermediate frequency amplifier coupled to the output of said mixer, and a detector coupling said intermediate frequency amplifier to said pulse analyzing means.

6. A radiation detection system comprising a reverse biased PN junction diode including a region depleted of electrons and holes by application of said reverse bias and disposed to receive incident radiation therein and respond thereto by the release of electron-hole pairs in proportional relation to said incident radiation, said electron-hole pairs defining unidirectional current pulses having a magnitude proportional to said incident radiation, each of said pulses being comprised of a plurality of radio frequency components each proportional to the magnitude of said pulses, a filter coupled to the output of said detector, said filter passive to a predetermined one of said components having a frequency, $f_s$, while being impassive to other radio frequency components, a lower sideband up-converter parametric amplifier for energization at a signal frequency equal to said frequency, $f_s$, and a pump frequency, $f_p$, to produce a lower sideband signal at a frequency, $f_p - f_s$, demodulation means coupled to said amplifier in receiving relation to said sideband signal for demodulating same to derive a component thereof having said frequency, $f_s$, and a pulse height analyzer coupled to said demodulation means in receiving relation to the sideband component having frequency, $f_s$.

References Cited by the Examiner

UNITED STATES PATENTS

| | | | |
|---|---|---|---|
| 2,958,045 | 10/1960 | Anderson | 330—4.5 |
| 3,160,750 | 12/1964 | Kiehn | 250—83.3 |

FOREIGN PATENTS

| | | |
|---|---|---|
| 911,334 | 11/1962 | Great Britain. |

OTHER REFERENCES

Kamal, A. K.: "A Parametric Device as a Nonreciprocal Element," Proceedings of the IRE, August 1960, pages 1424 to 1430.

RALPH G. NILSON, *Primary Examiner.*

JAMES W. LAWRENCE, *Examiner.*